United States Patent [19]
Brennan, Jr.

[11] Patent Number: 5,233,559
[45] Date of Patent: Aug. 3, 1993

[54] ROW REDUNDANCY FOR FLASH MEMORIES

[75] Inventor: James Brennan, Jr., Pilot Hill, Calif.

[73] Assignee: Intel Corporation, Santa Clara, Calif.

[21] Appl. No.: 653,786

[22] Filed: Feb. 11, 1991

[51] Int. Cl.⁵ ............................................. G11C 11/40
[52] U.S. Cl. ..................................... 365/200; 365/203; 365/210
[58] Field of Search ........... 365/200, 203, 210, 230.06, 365/900, 218; 371/10.3

[56] References Cited

U.S. PATENT DOCUMENTS 4,228,528 10/1980 Cenker et al. ................... 365/210 X
4,538,245 8/1985 Smarandoiu et al. ........... 365/210 X Primary Examiner—Steven Mottola
Attorney, Agent, or Firm—Blakely, Sokoloff, Taylor & Zafman

[57] ABSTRACT

A method and apparatus for providing row redundancy in non-volatile semiconductor memories is disclosed. This method and apparatus provides for preconditioning of each row of memory cells prior to erasing the memory array, including any rows containing defective cells as well as any redundant rows.

10 Claims, 9 Drawing Sheets

FIG _ 1 (PRIOR ART)

FIG_2 (PRIOR ART)

FIG_4 (PRIOR ART)

FIG _ 5 (PRIOR ART)

FIG_6

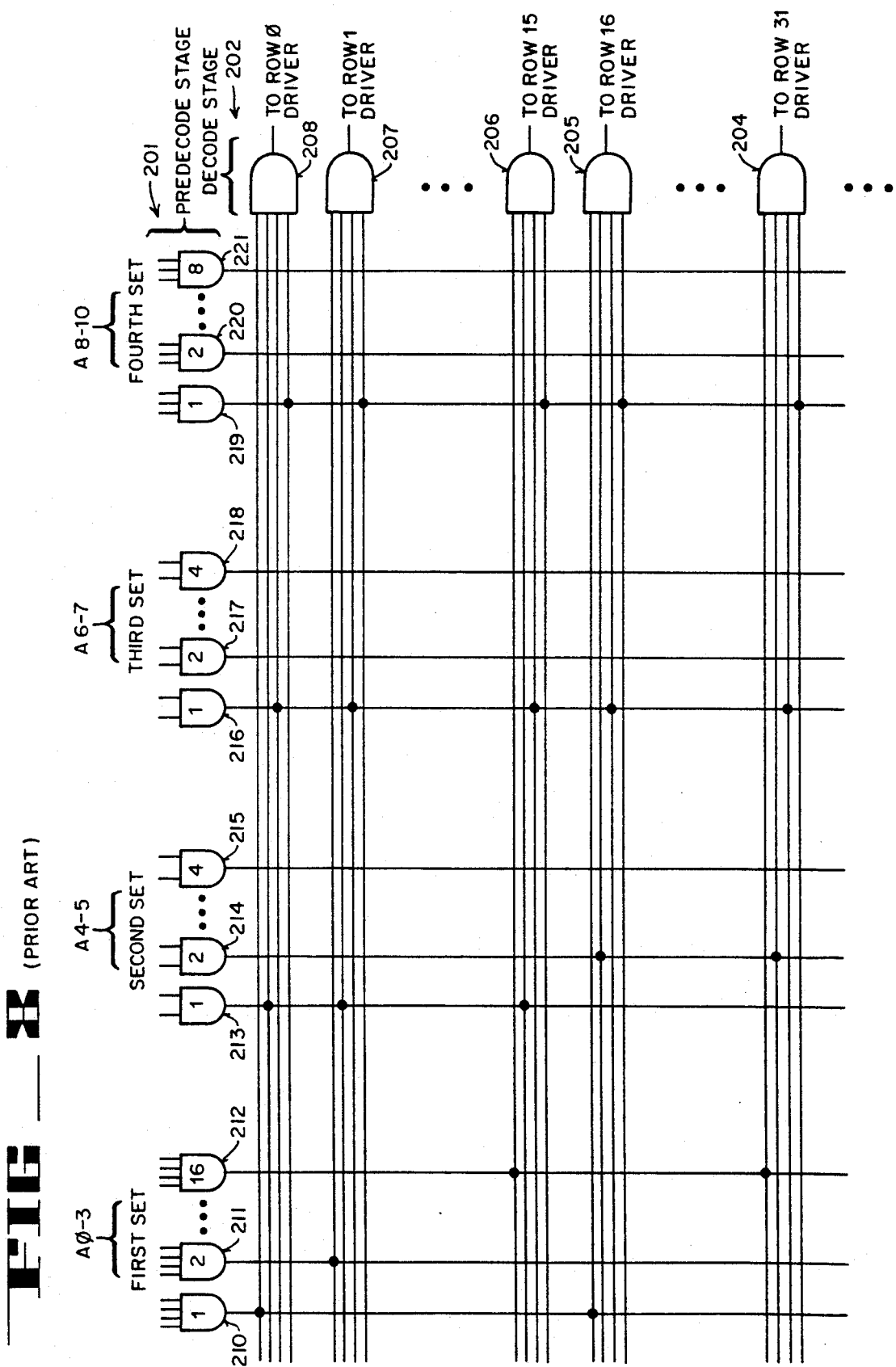

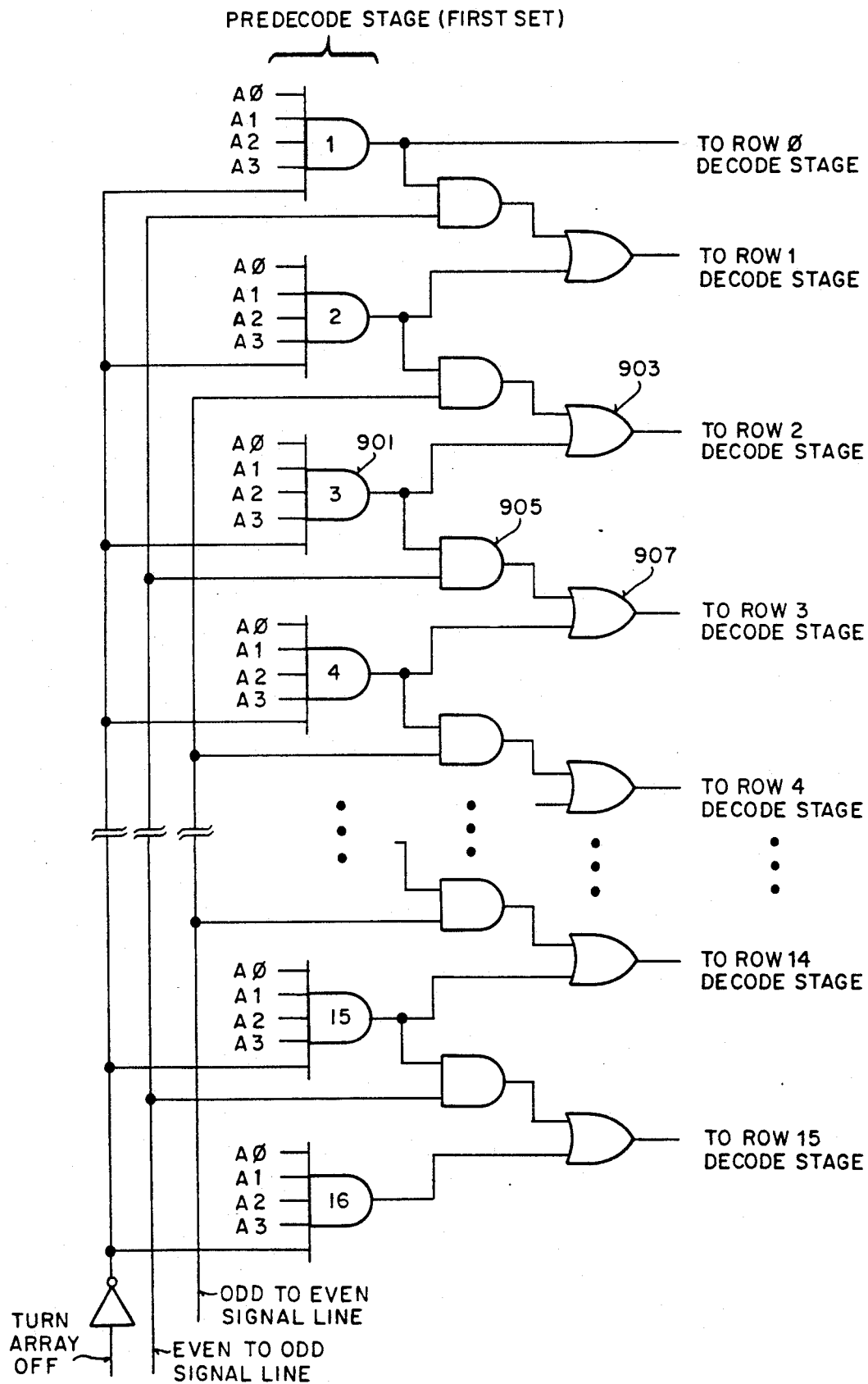
FIG_9

ROW REDUNDANCY FOR FLASH MEMORIES

FIELD OF THE INVENTION

The present invention relates to the field of non-volatile semiconductor memories. More specifically, the present invention relates to the field of electrically programmable read-only memories, particularly those employing floating gate memory devices.

BACKGROUND OF THE INVENTION

Metal-Oxide-Semiconductor (MOS) electrically programmable read-only memories (EPROMS) frequently use memory cells that have electrically isolated gates (floating gates). These floating gates are typically completely surrounded by insulation and formed from a polycrystalline silicon (polysilicon) layer. Information is stored in the memory cells or devices in the form of charge on the floating gates. Charge is transported to the floating gates by a variety of mechanisms such as avalanche injection, channel injection, tunnelling, etc., depending on the construction of the cells. The cells are erased generally by exposing the array to ultraviolet radiation. An example of these cells can be found in U.S. Pat. Nos. 3,500,142; 3,660,819; 3,755,721; and 4,099,196. In some cases these cells are electrically erasable (EEPROM cells). An example of such a cell is shown in U.S. Pat. No. 4,203,158.

The invention of the present application is used with an EPROM cell, particularly one which is electrically erasable, commonly referred to as a "flash" EPROM cell.

Due to the nature and design of flash EPROM cells, the entire array must be erased in order to erase any one cell in that array. Generally, this has not been a problem in that each row (word line) is separately addressable and each column (bit line) is either separately addressable or can be addressed in groups of 8 (comprising 1 byte). Further, prior to erasing the entire array, each memory cell in that array must be preconditioned.

Preconditioning is the process whereby a memory cell is programmed prior to erasure to avoid over-erasing the cell which can cause leakage within that cell resulting in false data readings. This occurs when a cell in the zero state undergoes an erase operation whereby it can be driven into the depletion mode. The column sense amplifier can read this leakage current falsely as an erased cell. Therefore, proper preconditioning is necessary to avoid over erasing a single cell which can in turn cause an entire array to be defective.

When a row (wordline) is found to be defective by the manufacturer, it is desirable to be able to assign an alternate row to take its place. Using an alternate row can thus increase the yield of working memory chips. However, due to the need to precondition each memory cell in the array prior to erasing that array, it is necessary to be able to precondition each row in the array; those that are working as well as those determined to be defective in the manufacturing test stage.

The difficulty in preconditioning both good rows and bad rows is several fold. First of all, because an alternate row has been set to take the place of the bad row, it may be difficult to address or access the bad row without also accessing the alternate row. Secondly, even if one could separately address the bad row, if the defect which caused that row to be bad was due to a short between that row and a neighboring row, then merely addressing the first bad row would not be sufficient to be able to precondition (program) that first bad row because it would merely short to the neighbor just as it did during manufacturing test. Thirdly, it was previously believed to not be possible to precondition both bad rows simultaneously as it was felt that one of the two bad rows would predominate by stealing all the current thus allowing it to be preconditioned but not allowing the other bad row to be preconditioned thus still exposing the other bad row (and thus the entire array) to the over-erasure problem.

SUMMARY AND OBJECTS OF THE INVENTION

One object of the present invention is to provide a memory array with redundant rows.

Another object of the present invention is to provide a memory array with redundant rows such that both defective rows and redundant rows are preconditioned.

These and other objects of the present invention are provided for by a memory array having a plurality of electrically programmable and electrically erasable memory cells each having a source region, drain region, floating gate and control gate. A plurality of bit lines are used, each of which is arranged in columns and is coupled to the drain regions of the memory cells in the column. The memory array has a first word line coupled to the control gate of each cell in a first row, a second word line coupled to the control gate of each cell in a second row, a third word line coupled to the control gate of each cell in a third row and a fourth word line coupled to the control gate of each cell in a fourth row. There is a means for decoding row addresses and for selecting word lines, such that if the first row is addressed for a read operation and if the first row is not functioning properly the third word line is selected, and if the second row is addressed for a read operation and if the second row is not functioning properly the fourth word line is selected. There is also a means for selecting a plurality of bit lines and for coupling the source regions of the memory cells coupled to the selected bit lines to a first potential for a programming operation, for coupling the source regions of the memory cells to the first potential for a read operation, and for coupling the source regions of the memory cells to a second potential for an erasure operation.

More specifically, during a preconditioning operation of the memory array, if the first row is addressed and if the first row is not functioning properly the decoding means selects the first word line and the second word line, and if the second row is addressed and if the second row is not functioning properly the decoding means selects the third word line and the fourth word line.

These and other objects are also provided for by a method of accessing alternate word lines in a memory array having a plurality of electrically programmable and electrically erasable memory cells each having a source region, drain region, floating gate and control gate. The memory array comprises a plurality of bit lines arranged in columns, each bit line coupled to the drain regions of the memory cells in the column. The memory array further comprises a first word line coupled to the control gate of each cell in a first row, a second word line coupled to the control gate of each cell in a second row, a third word line coupled to the control gate of each cell in a third row, and a fourth word line coupled to the control gate of each cell in a fourth row. The method comprises the steps of 1) if the first row is addressed for a read operation and if the first row is not functioning properly the third word line is selected, 2) if the second row is addressed for a read operation and if the second row is not functioning properly the fourth word line is selected, and 3) selecting a plurality of bit lines and coupling the source regions of the memory cells coupled to the selected bit lines to a first potential for a programming operation, to the first potential for a read operation, and to a second potential for an erasure operation.

More specifically, the method further comprises the step of 4) if the first row is addressed during a preconditioning operation and if the first row is not functioning properly the first word line and the second word line are selected, and 5) if the second row is addressed during a preconditioning operation and if the second row is not functioning properly the third word line and the fourth word line are selected.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which:

FIG. 8 is a more detailed logic diagram of the two stage X decoding scheme of FIG. 5;

FIG. 9 is a logic diagram of the even/odd defective word line pairing scheme of the present invention.

DETAILED DESCRIPTION

A method and apparatus for providing row redundancy in non-volatile semiconductor memories is disclosed. In the following description, numerous specific details are set forth, such as specific materials, devices, process steps, dimensions, sequences, etc., in order to provide a thorough understanding of the present invention. It will be obvious, however, to one skilled in the art that these specific details need not be employed to practice the present invention. In other instances, well-known processing steps and device configurations are not described in detail in order not to unnecessarily obscure the present invention.

Figure 1:
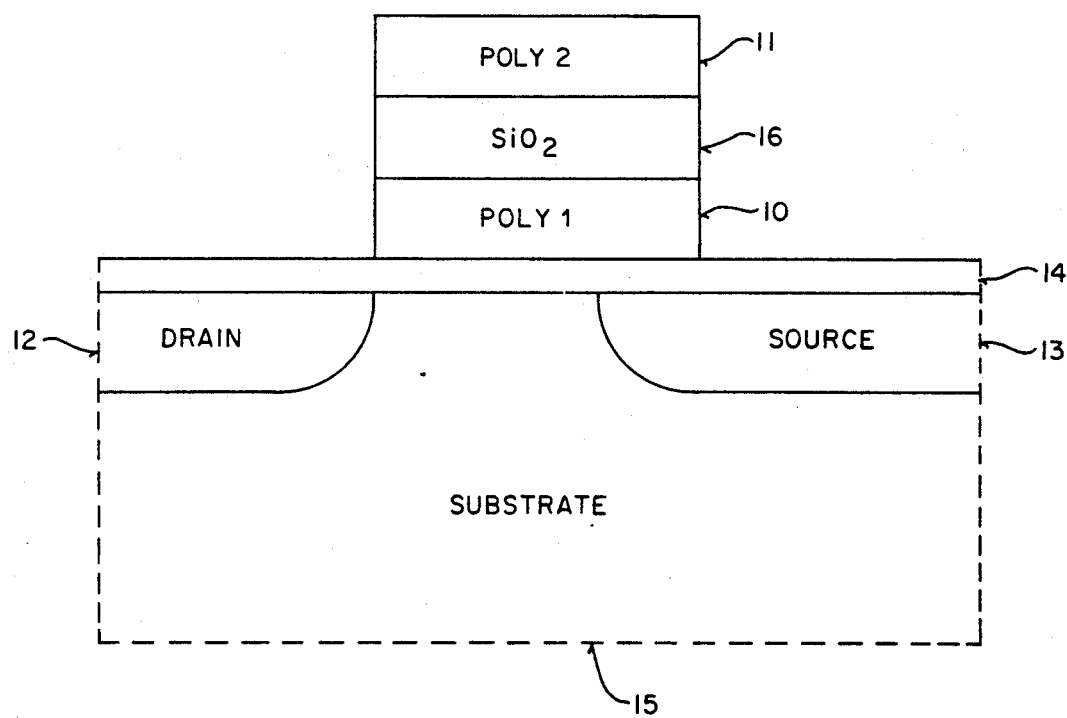
FIG. 1 is a cross-sectional elevation view of a prior art non-volatile floating gate memory device or cell used in the currently preferred embodiment of the present invention.

Referring now to FIG. 1, the memory device or cell used with the presently preferred embodiment is formed on a silicon substrate such as the p-type substrate 15 of FIG. 1. Please note that the device of FIG. 1 is shown in a partially fabricated state since this best reveals its structure. The device includes a pair of spaced-apart doped regions disposed in the substrate, specifically a drain region 12 and a source region 13. A polysilicon floating gate 10 is generally disposed above and between these regions and insulated from these regions by a layer of silicon dioxide or other insulative layer 14. The floating gate 10, at the completion of the processing, is completely surrounded by insulative layers and, hence, electrically floats. A second gate (control gate 11) is disposed above the floating gate 10; in the presently preferred embodiment this gate is fabricated from a second layer of polysilicon. This control gate is a continuous polysilicon strip forming a word line of the memory array of FIG. 2.

It will be appreciated that the cell of FIG. 1 may be fabricated using well-known NMOS or CMOS technology. The n-channel device illustrated in FIG. 1 may be fabricated directly in a p-type substrate or, when an n-type substrate is used, may be fabricated in a p-type well formed in the substrate. Other variations, such as employing both p-wells and n-wells, are well known in the art.

As currently employed, the memory devices are programmed (i.e., negatively charging the floating gate) by coupling the word line or control gate 11 to a potential of approximately +12 volts, the drain region to a potential of approximately +7 volts, and the source region to ground. With these conditions, channel hot electron injection occurs through the oxide layer 14 which layer, in the currently preferred embodiment, is approximately 115 Å thick.

To erase the cell, the drain region is floated, the word line or control gate 11 is grounded, and a potential of approximately +12 volts is applied to the source region. Under these conditions charge is tunnelled from the floating gate.

During reading of the cell, a positive potential less than that which would cause charge to transfer onto the floating gate is applied to the control gate (e.g., 5 volts) and a potential (e.g., 1 volt) is applied to the drain region. Current through the device is sensed to determine if the floating gate is or is not negatively charged. As with other floating gate devices, the negative charge on the floating gate shifts the threshold voltage of the device making it less conductive. Thus, with a sense amplifier, the presence or absence of charge on the floating gate can be determined. This defines whether a cell is programmed with a binary one or zero.

Figure 2:
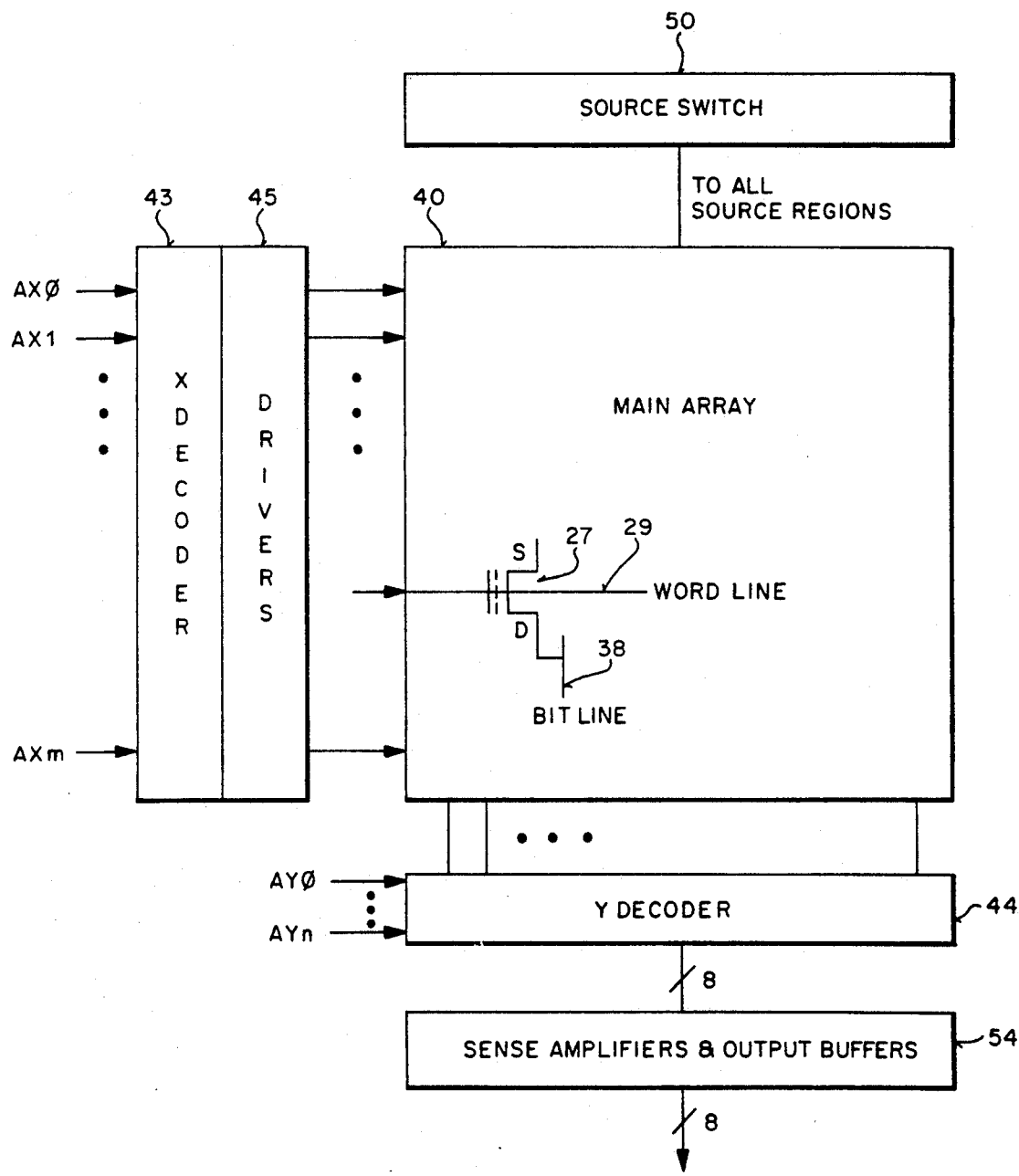
FIG. 2 is a block diagram of the layout of a prior art memory device.

Referring now to FIG. 2, the memory cells of a flash memory array are formed at intersections of word lines and bit lines, as is the common practice. The drain terminals of the memory cells are coupled to the bit lines. The control gates are formed from continuous strips of polysilicon which extend across the entire array to form the word lines. The generally parallel bit lines are perpendicular to the generally parallel word lines. For example, in memory array 40, cell 27 has its drain region coupled to bit line 38 and its source region 39 coupled to source switch 50. The word line 29 extends to a plurality of other cells along the word line. The source regions for all the cells in memory array 40 are connected to a common node-allowing this node to be switched to different potentials by source switch 50.

The X decoder 43 selects a single word line in memory array 40 for each of the addresses $A_{X0}-A_{Xm}$ applied to it. The Y decoders select one byte (8 bit lines) from memory array 40 for each of the Y addresses $A_{Y0}$–$A_{Yn}$ and couples 8 bit lines from memory array 40 to the sense amplifier and output buffers 54. Source switch 50 is controlled by Y decoder 44 and causes the source regions of the cells in the memory array to be coupled to the different potentials for reading, programming, and erasing.

Figure 3:
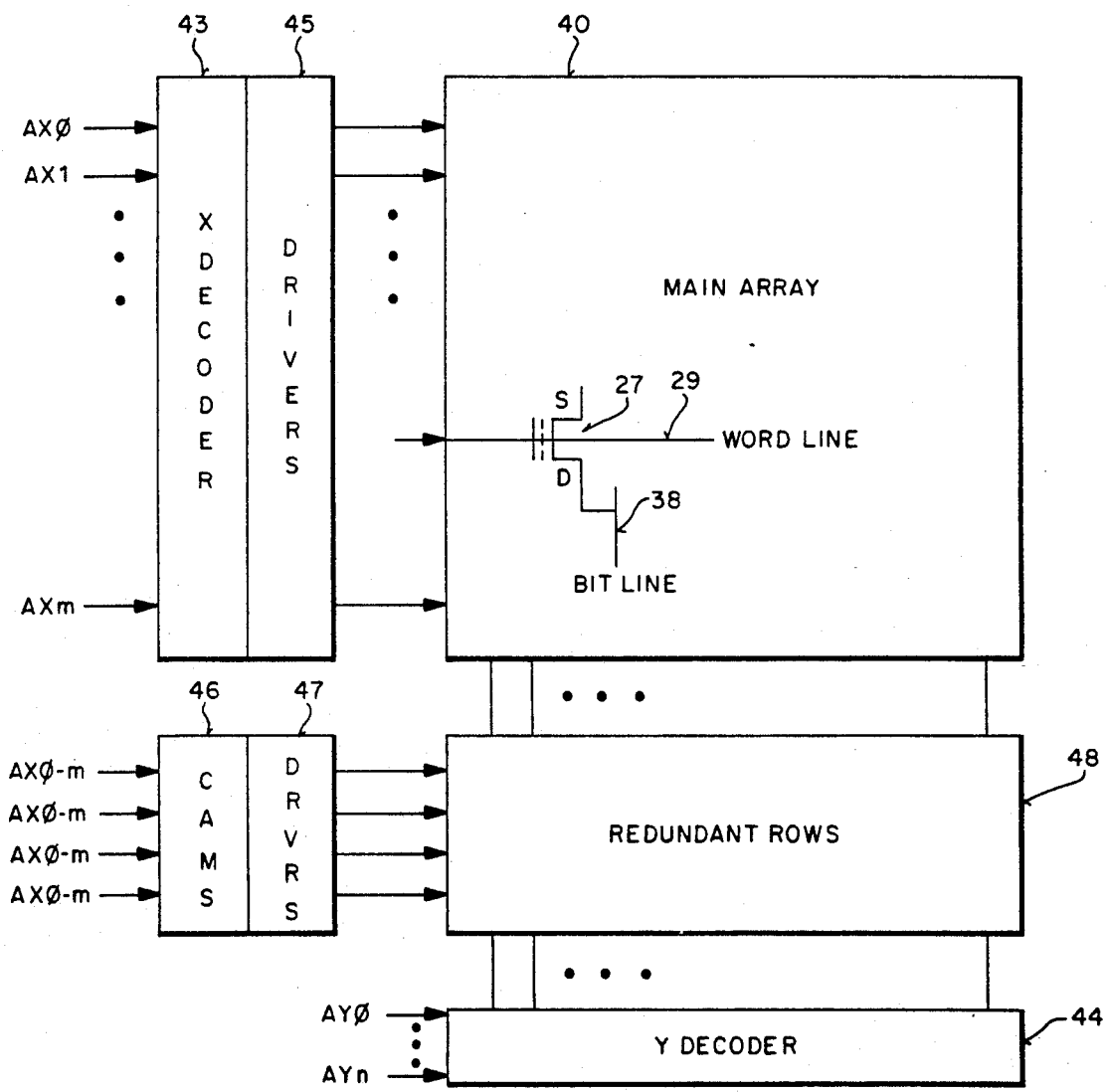
FIG. 3 is a block diagram of the layout of a memory device of the present invention.

Referring now to FIG. 3, the memory array and control means of the present invention can be seen. The memory array of the present invention is comprised of main array 40 and redundant rows 48. X decoder 43 decodes addresses $A_{X0}$–$A_{Xm}$ to select one word line of main array 40. The decoded address from X decoder 43 is input to one word line driver of drivers 45 to thus drive the selected word line (e.g., word line 29) of main array 40. Y decoder 44 decodes addresses $A_{Y0}$–$A_{Yn}$ to select one byte (8 bit lines) from main array 40 and redundant rows 48. Please note that source switch 50 and sense amplifiers and output buffers 54 of FIG. 2 are not shown in FIG. 3 to aid in clarity.

Figure 4:
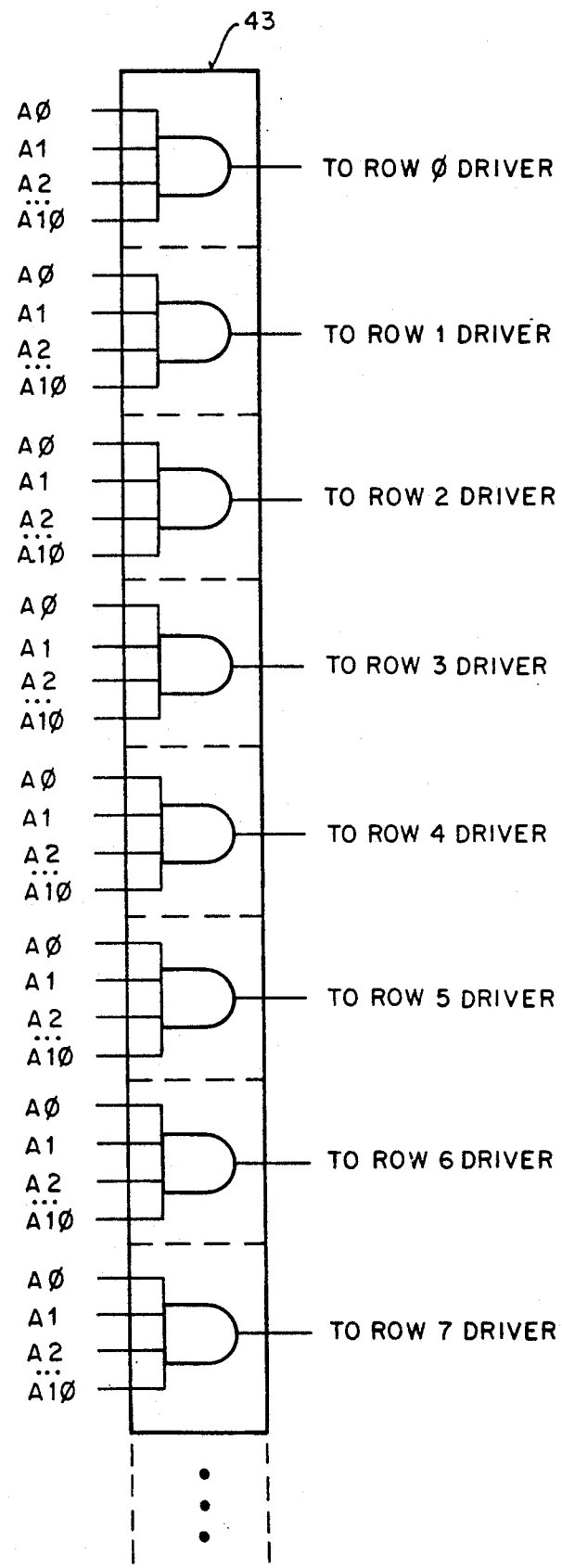
FIG. 4 is a logic diagram of a prior art X decoder used in the currently preferred embodiment of the present invention.

Referring now to FIG. 4, a simplified logic diagram of decoder 43 can be seen. X decoder 43, comprised of multiple decoders (only the first 8 decoders are shown in FIG. 4) which decode addresses $A_{X0}$–$A_{Xm}$ to select a single drive to drive one of the word lines of the memory array, can be most easily understood as a series of multiple input AND logic gates.

An AND logic gate, as is well known in the art, will provide a high output signal when all of its input signals are high. However, through the proper selection of inverters (not shown in FIG. 4), an AND gate can provide a high output signal for any combination of possible inputs. For example, if a particular AND gate is to be used to select the word line associated with the address of zero (all input signals low), then each of the inputs would merely need to first pass through an inverter to raise all of the input signals high. Similarly, for the address of one (all high order input signals low while the least significant bit input signal is high), then each of the high order inputs would first pass through an inverter while the least significant bit input signal would pass directly to the AND gate in order to achieve an all input signal high condition. Continuing in this fashion, all of the possible combinations of address input signals can be decoded by merely placing different combinations of inverters on the inputs to the AND gates.

In the preferred embodiment of the present invention there are 2048 word lines. As such, the decoders of X decoder 43 decode 1 of 2048 possible word line addresses. Therefore, each of the decoders of X decoder 43 of FIG. 4 can be represented by an 11-input (addresses $A_0$–$A_{10}$) AND gate which, again through proper selection of front-end inverters, can select 1 of 2048 combinations. Again, please note that only the first 8 of the total 2048 11-input AND gate decoders of X decoder 43 are shown in FIG. 4.

Although AND gates with numerous inputs most easily explain how the decoders of X Decoder 43 can select 1 of 2048 (or any other number of potential combinations one may need to select from), using numerous input AND gates is not practical due to chip size and power requirements. Instead, a cascade of AND gates is used as can be seen with reference to FIG. 5.

Figure 5:
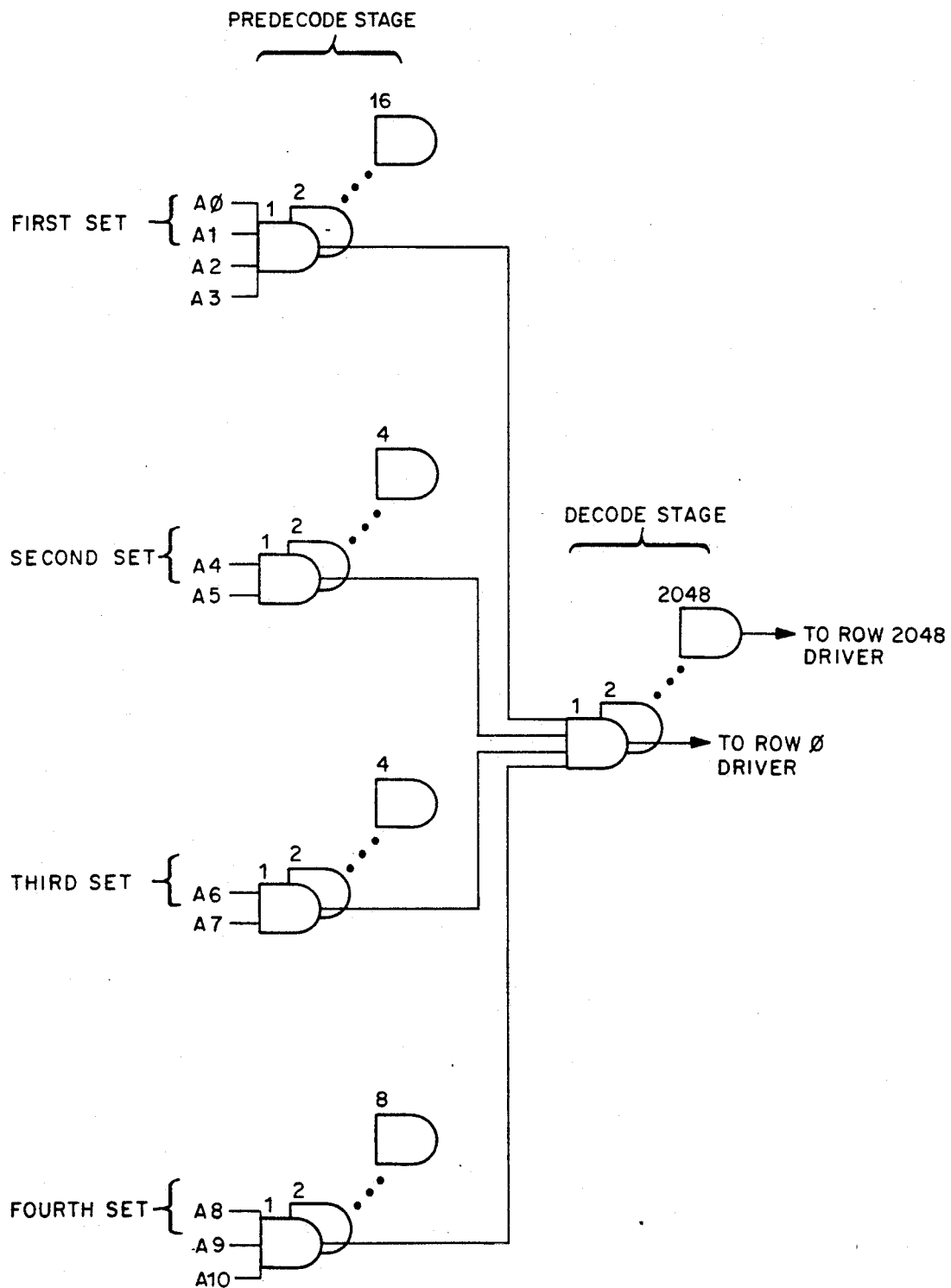
FIG. 5 is a logic diagram of a two stage X decoding scheme of the prior art configured to select 1 of 2048 addresses.

FIG. 5 shows a two stage X decoding scheme for X decoder 43 of FIG. 2 and configured to select 1 of 2048 word lines. The first stage, or predecode stage, takes groups of the address input signals $A_{X0}$–$A_{Xm}$ and inputs them to a parallel set of AND gates. The second stage, or decode stage, takes the output of the first stage and selects one of the 2048 word line drivers of drivers 45 of FIG. 3 which in turn drives one of the word lines of main array 40.

The predecode stage is made up of 4 sets of AND gates. The first set is comprised of 16 4-input AND gates each of which receives as input the four low order (least significant) address bits (denoted $A_0$–$A_3$ in FIG. 5 and which correspond to $A_{X0}$–$A_{X3}$ of FIGS. 2 & 3). Each of the 16 4-input AND gates of the first set outputs a different predecode signal, again due to different combination of inverters placed on their input signal lines. In this way, the 16 4-input AND gates of the first set of the predecode stage can decode all 16 possible combinations from the low order 4 bits of the input address.

The second set of the predecode stage is comprised of 4 2-input AND gates each of which receives as input the next 2 significant address bits (denoted $A_4$–$A_5$ in FIG. 5 and which correspond to $A_{X4}$–$A_{X5}$ of FIGS. 2 & 3). Each of the 4 2-input AND gates of the second set outputs a different predecode signal, again due to different combinations of inverters placed on their input signal lines. In this way, the 4 2-input AND gates of the second set of the predecode stage can decode all 4 possible combinations from the next 2 significant bits of the input address.

The third set of the predecode stage is also comprised of 4 2-input AND gates each of which receives as input the next 2 significant address bits (denoted $A_6$–$A_7$ in FIG. 5 and which correspond to $A_{X6}$–$A_{X7}$ of FIGS. 2 & 3). Each of the 4 2-input AND gates of the third set outputs a different predecode signal, again due to different combinations of inverters placed on their input signal lines. In this way, the 4 2-input AND gates of the third set of the predecode stage can decode all 4 possible combinations from the next 2 significant bits of the input address.

The fourth set of the predecode stage is comprised of 8 3-input AND gates each of which receives as input the 3 most significant address bits (denoted $A_8$–$A_{10}$ in FIG. 5 and which correspond to $A_{X8}$–$A_{Xm}$ of FIGS. 2 & 3). Each of the 8 3-input AND gates of the fourth set outputs a different predecode signal, again due to different combinations of inverters placed on their input signal lines. In this way, the 8 3-input AND gates of the fourth set of the predecode stage can decode all 8 possible combinations from the 3 most significant bits of the input address.

Referring again to FIG. 5, the decode stage of X decoder 43 is made up of 2048 4-input AND gates each of which receives as input a different combination of 4 outputs from the predecode stage to thus decode the 2048 possible address combinations. Each of the 2048 4-input AND gates of the decode stage in turn selects a different row driver to thus drive the selected word line in Main Array 40.

With reference to FIG. 8 a more detailed view of the two stage decoding scheme of FIG. 5 can be seen. In FIG. 8, the predecoding stage 201 (comprising 4 sets of AND gates) is shown having vertical outputs which intersect at different points the horizontal inputs of the decoding stage 202 (comprising 2048 4-input AND gates). These intersections of predecoding stage outputs and decoding stage inputs more clearly show the varying inputs to the decoding stage 202 from the predecoding stage 201.

As can be seen in FIG. 8, the inputs to the 4-input AND 208 gate of the decode stage 202 which signals the row 0 driver receive as a first input signal the output from the first 4-input AND 210 gate of the first set of the predecode stage 201. Conversely, the inputs to the 4-input AND gate 207 of the decode stage 202 which signals the row 1 driver receive as a first input signal the output from the second 4-input AND gate 211 of the first set of the predecode stage 201.

Similarly, the inputs to the 4-input AND gate 206 of the decode stage 202 which signals the row 15 driver receive as a first input signal the output from the sixteenth 4-input AND gate 212 of the first set of the predecode stage 201. However, the inputs to the 4-input AND gate 205 of the decode stage 202 which signals the row 16 driver receive as a first input signal the output from the first 4-input AND gate 210 of the first set of the predecode stage 201 just as the 4-input AND gate 210 which signals the row 0 driver does. However, in order to decode addresses which vary by more than 16, the inputs to the 4-input AND gate 205 of the decode stage 202 which signals the row 16 driver receive as a second input signal the output from the first 2-input AND gate 213 of the second set of the predecode stage 201.

The inputs to the remaining AND gates of the decode stage 202 of X decoder 43 continue in this progressive selection of varying combinations of output signals from the predecode stage. In this way, and as stated above, the 4-input AND gates of the decode stage 202 (together with the 4 sets of AND gates of the predecode stage 201) of X decoder 43 can decode each of the different input addresses and can signal a different row driver in each case.

Referring again to FIG. 3, if a defective word line is discovered (e.g., one word line is found to be shorted to another word line) when main array 40 is tested following production of the device, an alternate word line in redundant rows 48 may be selected by the manufacturer by setting the address of the shorted word line in one of the Content Addressable Memories (CAMS) of CAMS 46 (CAM operation is discussed in more detail below). In this way, when a defective word line in main array 40 is later addressed by the user, the CAM in CAMS 46 which is set to that address will select the associated driver in drivers 47 to drive the alternate word line in redundant rows 48 instead of the defective word line in main array 40.

Figure 6:
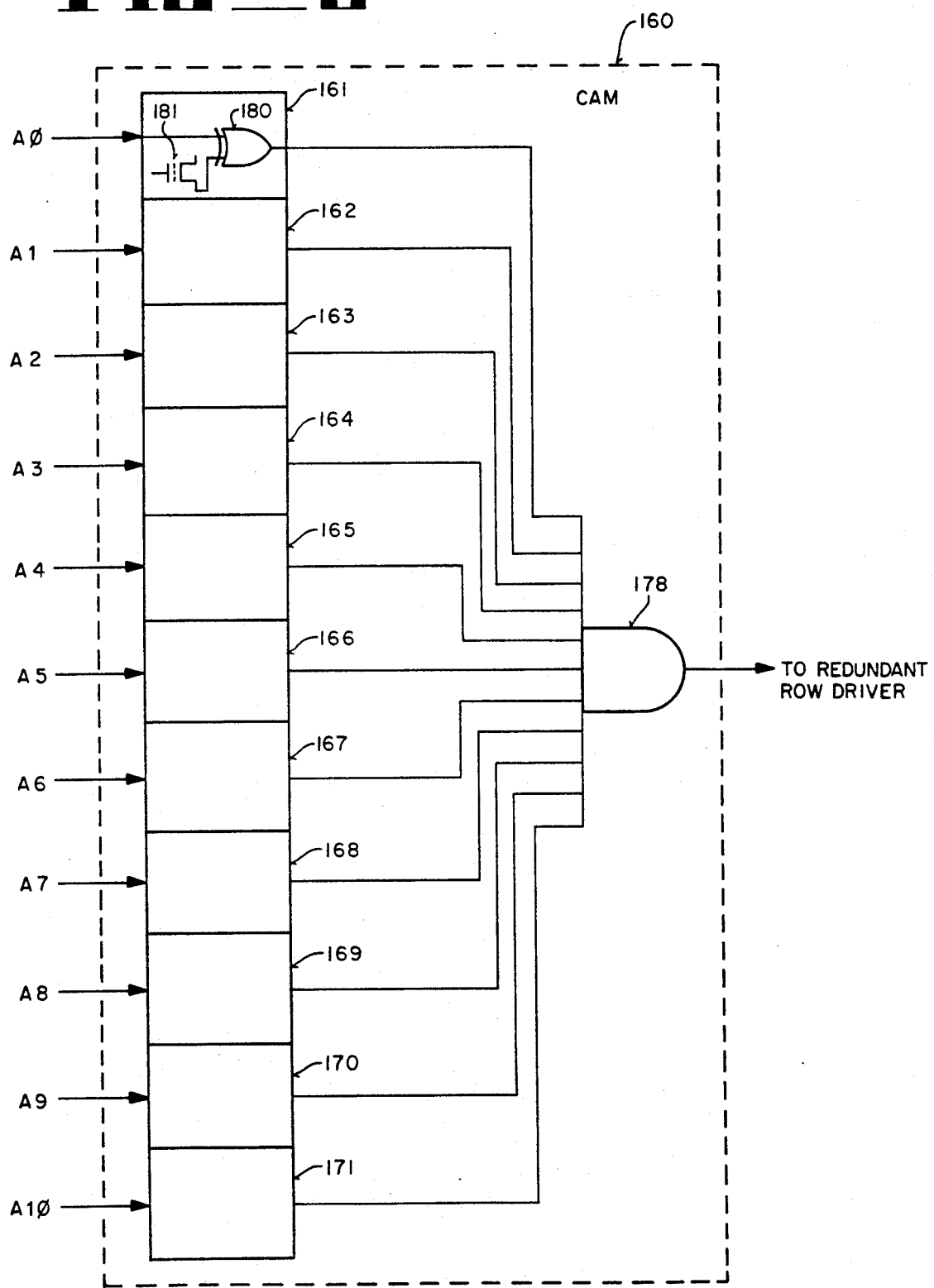
FIG. 6 depicts a content addressable memory of the prior art configured to support an 11 bit address.

Referring now to FIG. 6, one CAM 160 of CAMS 46 can be seen. CAM 160 can be most easily understood as a set of comparison blocks 161 through 171 (one for each bit of the input address) the outputs of which are fed into a single multiple-input AND gate 178. Each comparison block contains both a memory cell (e.g., cell 181) set to one address bit and an Exclusive NOR (XNOR) gate (e.g., gate 180) to do the comparison. Each address $A_{X0}$-$A_{Xm}$ ($A_0$-$A_{10}$ in the preferred embodiment) is input to each CAM where each comparison block checks its relevant bit.

In other words, when a word line of main array 40 (FIG. 3) is addressed each CAM of CAMS 46 individually checks for a match with one of the alternate redundant row word lines. Each bit of the input address is checked within each CAM by comparing the stored bit in the memory cell with one bit of the input address. The comparison is done with an XNOR gate which will only output a high signal when both of its inputs are the same, either both high or both low, as is well known in the art.

The AND gate 178 of the CAM 160 receives as inputs the output of each of the XNOR gates in the comparison blocks 161-171. The AND gate 178 will only output a high signal if each comparison block is outputting a high signal. That is, the AND gate 178 will only drive the word line driver for its associated redundant row if every comparison block in that CAM 160 finds a match between its stored address bit and the incoming address bit. In this way, when the address of the defective word line in main array 40 is set in one of the CAMS of CAMS 46 (FIG. 3), when that address is input to the memory array the alternate word line in redundant rows 48 (FIG. 3) is selected by that CAM.

Referring to FIG. 3, of course, merely selecting and driving an alternate word line does not by itself avoid using the defective word line in main array 40. This is because the decoder in X decoder 43 will still decode that address and will thus drive the defective word line. Then, because the 8 bit lines selected by Y decoder 44 connect to all the drains of the memory cells of both main array 40 and redundant rows 48, merely driving an alternate word line in Redundant Rows 48 will not by itself prevent attempting to read or write to the defective word line in main array 40. Additional logic circuitry is therefore used to turn main array 40 off as needed.

However, when main array 40 (along with redundant row 48) is erased, because the entire main array 40 and all of the word lines of redundant row 48 will be erased (again, due to the nature of flash memory), each row must first be preconditioned. Preconditioning is programming prior to erasure to avoid over erasing the memory cells which could cause them to go into depletion which then causes the entire array to fail.

Figure 7:
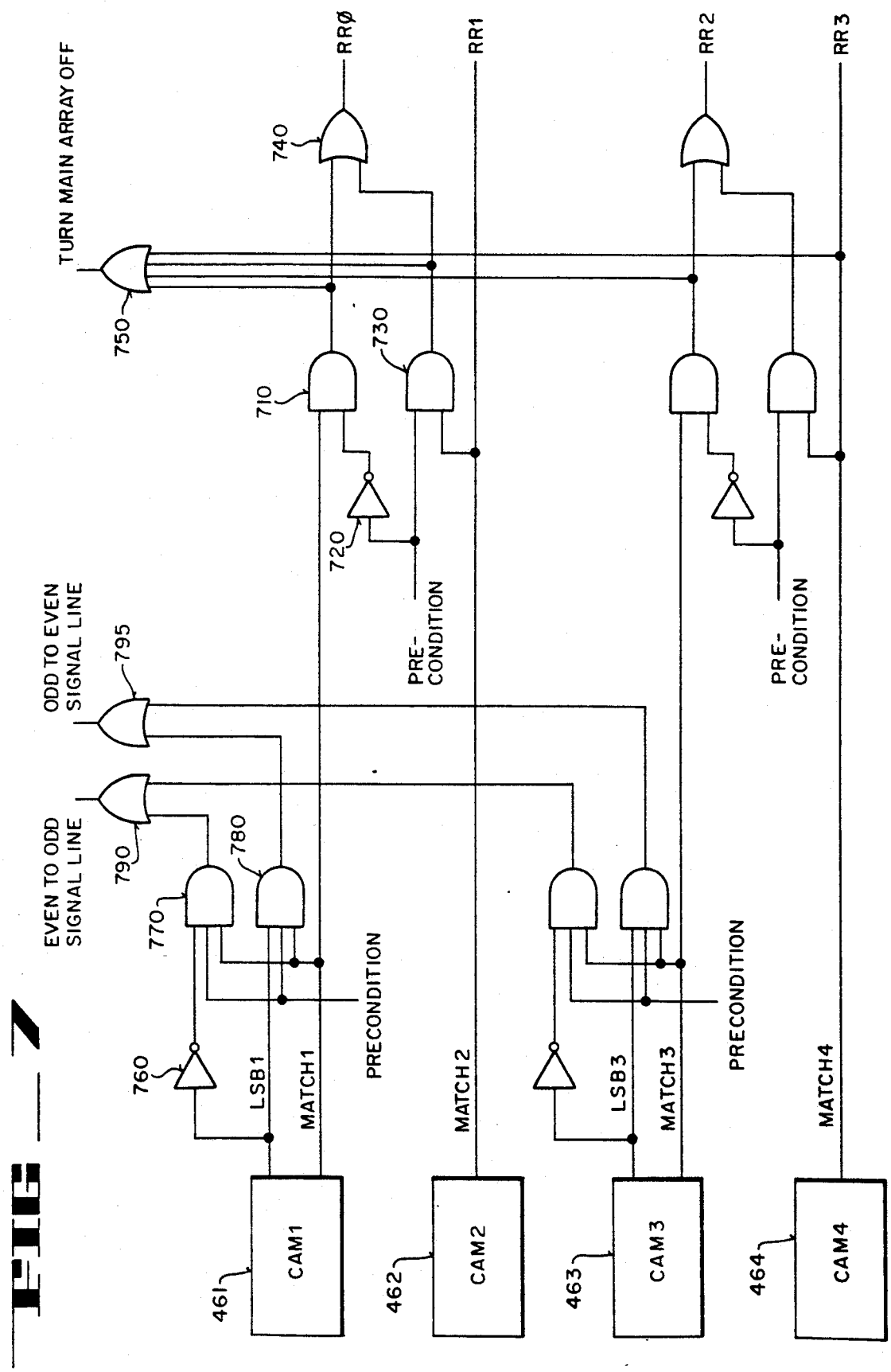
FIG. 7 is a logic diagram showing the connections between the CAMS, the redundant row drivers, and the main array.

Referring now to FIG. 7, when CAM 1 (reference number 461) finds a match between the input address $A_{X0}$-$A_{Xm}$ and the set of stored address bits, CAM 1 will output a high signal on MATCH 1 signal line. This high signal is intended to drive the word line driver for the alternate redundant row when the address is being used for a read or write operation. During a read or write operation (as opposed to a precondition operation) the input to inverter 720 is a low signal in which case the output of inverter 720 is a high signal. Thus during a read or write operation AND gate 710 sees high signals on both of its inputs and will therefore output a high signal. OR gate 740, receiving the high output signal from AND gate 710 will thus output a high signal on RR0 which is the signal line to the driver of drivers 47 which will in turn drive the alternate word line in redundant rows 48 of FIG. 3.

Note that the output of AND gate 710 is also input to OR gate 750. OR gate 750, seeing a high input signal from AND gate 710 during a read or write operation, will output a high signal to turn main array 40 of FIG. 3 off. The connection and function of the output signal line from OR gate 750 to main array 40 will be discussed more fully below.

Thus, during a read or write operation, when CAM 1 decodes a match between its stored address and its input address it will not only signal its associated driver to drive the alternate word line in redundant rows 48 but it will also signal main array 40 to turn off. In this way, the desired alternate good row will be selected instead of the defective bad row.

Further, as can be seen by the four inputs to OR gate 750, whenever any one of the four CAMS numbered 461-464 as shown in FIG. 7 detects a match between its stored address and an input address, during either a read or a write operation, OR gate 750 will signal main array 40 to turn off.

If an erase operation is to be performed a precondition operation should first be done for the reasons discussed above. When a precondition operation is to be performed inverter 720 receives a high input signal and thus provides a low output signal. Then, although CAM 1 (reference number 461) may be outputting a high MATCH 1 signal, AND gate 710 outputs a low signal due to the low input signal from inverter 720. Therefore, although a match may be found by CAM 1, OR gate 740 will not provide a high output signal to the driver for redundant row 0 (RR0) because neither of its input signals is high.

Additionally, although a match may have been found by CAM 1, due to the low output signal from AND gate 710 OR gate 750 will not output a high signal to turn main array 40 off. In other words, although a match is found by CAM 1, neither the redundant row is selected nor is main array 40 turned off during a precondition operation on the address set in CAM 1.

Of course, the objective during a precondition operation is to precondition both the defective row (and its defective neighbor) as well as the alternate redundant rows. This is because, as stated above, if any individual row is not preconditioned before the entire memory array is erased, the entire memory array is eventually exposed to leakage from over-erasure of the one or more cells along that word line which was not preconditioned prior to erasure. Preconditioning all of the word lines, both good ones and bad ones, is thus necessary.

As stated above, CAM 1 (reference number 461) outputs a high signal when a match is found between the input address and the address stored in CAM 1. Then prior to an erasure operation, AND gates 770 and 780 help determine which rows in Main Array 40 get selected for preconditioning. In other words, when CAM 1 outputs a high signal and when a precondition operation is occuring, either AND gate 770 or AND gate 780 will output a high signal depending upon whether the least significant bit of the input address to CAM 1 is high or low.

In other words, if the least significant bit of the input address to CAM 1 is low (in which case the input address is an even address) then inverter 760 will provide a high input signal to AND gate 770 which will in turn provide a high input signal to OR gate 790. Conversely, if the least significant bit of the input address to CAM 1 is high (in which case the input address is an odd address) then CAM 1 will provide a high input signal to AND gate 780 who will in turn provide a high input signal to OR gate 795.

In this way, during a precondition operation whenever there is a match between an input address to CAM 1 and the address stored in CAM 1, either OR gate 790 will provide a high output signal (thus indicating that the input address was even) or OR gate 795 will provide a high output signal (thus indicating that the input address was odd).

Remembering that the objective is to precondition each row (defective as well as functioning) of the memory array before erasing the entire memory, the even-/odd address signal lines are used to indicate which additional word line in main array 40 will be selected when a CAM finds a match during a precondition operation. And because inverter 720, by outputting a high signal during a precondition operation, prevented AND gate 710 from outputting a high signal to both OR gate 750 and OR gate 740, neither redundant row RR0 is selected nor is main array 40 turned off. Therefore, during a precondition operation when a defective row in main array 40 is addressed the word line in main array 40 is selected and main array 40 will not be turned off. Further, its neighboring defective word line will also be selected, as is explained below, through the use of the even/odd signal lines from OR gates 790 and 795.

Selecting both the addressed word line and the neighboring word line in main array 40 enables a precondition operation of a defective word line and its neighbor. Because an electrical short between adjacent row word lines is a prevalent form of row defects, it has been discovered that one way to precondition a shorted word line is to select both word lines which are shorted together to thus precondition them together.

Referring now to FIGS. 3 and 9, a portion of the predecode stage (the first set of FIG. 5) of X decoder 43 of main array 40 can be seen. The array off signal from OR gate 750 of FIG. 7 can be seen in the lower left hand corner of FIG. 9. Additionally, both the even to odd signal line from OR gate 790 of FIG. 7 and the odd to even signal line from OR gate 795 of FIG. 7 can be seen in the lower left hand corner of FIG. 9.

FIG. 9 shows the first set of 16 4-input AND gates of the predecode stage of X decoder 43 of main array 40. FIG. 9, however, includes 5-input AND gates instead of the 4-input AND gates wherein the fifth input is the inverted Array Off signal from OR gate 750 of FIG. 7. In this way, when OR gate 750 of FIG. 7 is high (indicating a match between one of the CAMS in CAMS 46 during a read or write operation), none of the 16 5-input AND gates of the first set of the predecode stage of X Decoder 43 shown in FIG. 9 will output a high signal and therefore none of the 2048 4-input AND gates of the decode stage of X decoder 43 will output a high signal and therefore none of the drivers in drivers 45 will drive any of the word lines in main array 40.

Conversely, when a CAM in CAMS 46 find a match during a precondition operation, OR gate 750 will output a low signal which, when inverted prior to being inputted to the 16 5-input AND gates, will cause the entire main array 40 to be operational (because each of the 16 5-input AND gates will see a high signal thus effectively turning the array on). Further, during a precondition operation when a CAM finds a match, either the even to odd signal line will necessarily be high or the odd to even signal line will necessarily be high. Then, because main array 40 is operational, the one decoder of X decoder 43 which has decoded the input address and selected its associated driver will cause the selected word line in main array 40 to be driven.

If the driven word line in main array 40 is an even address word line, for example if the selected word line address corresponds to row 2, then the output of the 5-input AND gate 3 (reference number 901) will be a high signal to OR gate 903 which will in turn signal the decode stage of X Decoder 43 to select row 2 of Main Array 40. Additionally, because row 2 is an even address, the even to odd signal line will have been driven high (as explained above) by OR gate 790 of FIG. 7. Because the high output from AND gate 901 is also input to AND gate 905, when the even to odd signal line (also input to AND gate 905) also goes high, AND gate 905 will output a high signal. When AND gate 905 outputs a high signal OR gate 907 will output a high signal to the decode stage of X decoder 43 which will cause the driver of row 3 in drivers 45 to drive the word line for row 3. Note that if the input address had been an odd address then the odd to even signal line would have been high and the neighbor row to the odd addressed word line in main array 40 would have selected.

In this way, whenever a precondition operation is performed and a match is found by a CAM, both the input address row word line and the adjacent odd/even address row word line of main array 40 are selected. This enables addressing both shorted word lines in main array 40 so as to be able to precondition them prior to erasure of the entire memory array.

As for preconditioning the redundant rows, because the precondition signal caused the first redundant row RR0 of redundant rows 48 to not be selected (as explained above), something else must occur in order to precondition that word line. Additionally, the neighboring redundant word line (which is the alternate row word line for the second of the pair of shorted word lines in main array 40) must also be preconditioned prior to erasing the entire memory array. Addressing the two redundant rows RR0 and RR1 in redundant rows 48 is achieved as follows with reference again to FIG. 7.

Referring to FIGS. 3 and 7, when the preconditioning operation reaches the second address of the pair of redundant rows, CAM 2 (reference number 462) sees a match between its stored address and the input address. CAM 2 therefore outputs a high signal to the driver in drivers 47 to drive the second alternate word line in redundant rows 48. When CAM 2 outputs a high signal on RR2, OR gate 750 sees this high input and signals main array 40 to turn off.

The high output signal from CAM 2 is also input to AND gate 730 which, together with the high precondition signal, causes AND gate 730 to output a high signal to OR gate 740. OR gate 740, upon seeing the high input signal from AND gate 730 will signal the driver in drivers 47 to drive the first alternate word line in redundant rows 48.

Therefore, when CAM 2 finds a match during a precondition operation, both the first and the second alternate word lines are selected in redundant rows 48 while main array 40 is turned off. In this way, when the second of a pair of shorted word lines is addressed during a precondition operation, both of the two redundant word lines in redundant rows 48 is selected and the main array 40 is turned off. Please note that CAM 3 and CAM 4 operate essentially identically to CAM 1 and CAM 2 as they are merely supporting a second set of redundant row word lines. Multiple pairs of redundant rows can be supported by this scheme while only two sets of two redundant rows have been shown.

The logic, as shown in FIG. 9, which selects shorted row word line pairs within main array 40 during a precondition operation and which is placed between the predecode stage and the decode stage of X decoder 43, can select either row 0 and row 1, or row 1 and row 2, or row 2 and row 3, etc. This pair selection, as was explained above, depends upon which rows were determined to be shorted together, X decoder 43 selecting the first row word line of the pair, and whether a precondition operation is being performed, among other things. However, in the preferred embodiment of the present invention, if row 15 and row 16 are shorted together and there is an attempt to select row 15 and row 16 during a precondition operation row 16 would not be selected.

To understand why both row 15 and row 16 would not be selected during a precondition operation one must first remember that the X decoder 43 is optimized (based on chip space and power requirements) to decode 1 of 2048 word line addresses by grouping the input address bits into four sets of AND gates (as was discussed with reference to FIGS. 5 and 8). Then, because the logic which selects the next even (or odd, as appropriate) row word line of main array 40 is located between the first set of 16 AND gates of the predecode stage and the 2048 AND gates of the decode stage of X decoder 43 the resolution of this logic to pairs within each multiple of 16 row word lines of main array 40 is thus limited. In other words, because the first set of AND gates of the predecode stage is shared by each multiple of 16 row addresses (again, to optimize X decoder 43), placing the pair selection logic only on the output of this set of the predecode stage necessarily limits the pair selection to pairs within each group of 16 row word lines.

This limitation, overcome in alternative embodiments as explained below, can be more easily explained with reference again to FIG. 8. The X decoding scheme of the preferred embodiment as can be seen in FIG. 8 shows that the first AND gate of the first set of the predecode stage of X decoder 43 is shared by the AND gates of row 0 and row 16 (and row 32, 48, 64, etc.) of the decode stage of X decoder 43.

In further explanation, the only difference in inputs to the AND gates of row 0 and row 16 is the connection from the second set of AND gates of predecode stage. That is, to decode 1 of 2048 address the AND gate of row 0 receives as its 4-inputs the output of i) the first AND gate of the first set of the predecode stage; ii) the first AND gate of the second set of the predecode stage; iii) the first AND gate of the third set of the predecode stage; and, iv) the first AND gate of the fourth set of the predecode stage. Similarly, to decode 1 of 2048 addresses the AND gate of row 16 receives as its 4-inputs the output of i) the first AND gate of the first set of the predecode stage; ii) the second AND gate of the second set of the predecode stage; iii) the first AND gate of the third set of the predecode stage; and, iv) the first AND gate of the fourth set of the predecode stage.

Therefore, when the logic which selects shorted row word line pairs is placed only on the first set of AND gates of the predecode stage (as in the preferred embodiment of the present invention), this logic is unable to select the row word line pair of row 15 and its next even neighbor (row 16) because there is no AND gate (such as AND gate 905 of FIG. 9) to signal an OR gate (such as OR gate 907 of FIG. 9) to signal the driver for row 16. Note that essentially the same situation occurs between rows 31 and 32, rows 47 and 48, etc.

Of course, it is possible to add the logic which selects shorted row word line pairs to the outputs of each set of AND gates of the predecode stage. And there is no concern about improperly selecting more than one row word line pair at a time because the logic which selects shorted row word line pairs also depends upon decoding the first row word line of the pair and therefore the only pair which would actually be selected would be the proper first row word line and its next even or odd row word line which is thus the desired shorted row word line pair.

To repeat, if the additional logic which selects the second of the shorted row word line pairs (regardless of whether that happens to be an even or an odd word line), as shown connected to the first set of AND gates of the predecode stage in FIG. 9, were to be added throughout the four sets of AND gates in the predecode stage then any address combination of shorted row word line pairs could be selected during a precondition operation by X decoder 43 decoding and selecting the first shorted row word line of the pair and by the additional logic selecting the neighboring even (or odd, as the particular case may be) row word line.

The preferred embodiment of the present invention, while not able to select every sixteeth pair of shorted word lines, thus exposes each device to a 1 in 16 chance of a defect attributable to a shorted row word line which cannot be addressed by the preferred embodiment of this redundant row scheme. Alternative embodiments eliminate this exposure but require additional logic do to so. This additional logic takes up additional space on the chip thus potentially increasing die size. Therefore, in the preferred embodiment of the present invention, a balance has been struck whereby chip space considerations outweigh the potential 6% chance of a short which might occur between every 16th row word line pair during manufacturing of the device.

Additionally, in the preferred embodiment of the present invention, during fabrication of the memory cell as discussed above with reference to FIG. 1, a metal 1 layer is laid down to form the bit lines of the memory device. After laying down an insulative layer a metal 2 layer is then laid down as an independent interconnect layer. The metal 2 layer forms lines paralleling the word lines of the memory device.

The metal 2 layer can be strapped (electrically connected at various points or intervals across the memory array) to the underlying parallel word lines. Strapping a metal 2 line to an underlying parallel word line lowers the resistance of the word line by acting as a parallel resistor. This reduction in word line resistance allows the voltage applied to a word line to ramp much more quickly which results in improved device performance. For example, through simulations and test devices with metal 2 lines strapped to the underlying word lines, roughly a 20% improvement in device read times (from approximately 100 nS to approximately 80 nS) has been shown.

In the past, strapping metal 2 lines to the parallel word lines has been a problem because it increases the likelihood of electrical shorts between neighboring word lines. Because the metal 2 lines are formed later in the fabrication process, they are formed when the device is less planar than when the earlier layers were formed. As such, the metal 2 lines must cross the hills and valleys caused during the typical chip fabrication. Crossing these hills and valleys is more difficult in that the resolution of the typical photolithograpy process is lessened by this more irregular surface. Therefore, each metal 2 line is more likely to incur either physical separation as it attempts to traverse the device or alternatively, to make electrical contact with a neighboring metal 2 line.

This exposure to electrical shorts between neighboring metal 2 lines makes strapping them to underlying word lines a risky proposition when there is no row redundancy built into the device. Stated differently, strapping metal 2 lines to underlying word lines increases device performance while also increasing the likelihood of device defects. In the past, the gains in performance have not been deemed worth this reduced device yield.

By providing row redundancy, metal 2 lines can now be strapped to the word lines and if a metal 2 line and word line is found to be shorted to a neighboring metal 2 line and word line then a pair of redundant rows may be assigned to take the place of the shorted rows. In this way, the improved performance gained by strapping metal 2 lines to word lines may be enjoyed without significantly affecting device yield.

In the foregoing specification, the invention has been described with reference to the presently preferred embodiment thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

What is claimed is:

1. A memory array having a plurality of electrically programmable and electrically erasable memory cells each having a source region, a drain region, a floating gate and a control gate, the memory array comprising:
   a plurality of bit lines arranged in columns, each of the plurality of bit lines being coupled to the drain region of each of a number of the memory cells in one column;
   a first word line in a first row, the first word line being coupled to the control gate of each of a number of the memory cells in the first row;
   a second word line in a second row, the second word line being coupled to the control gate of each of a number of the memory cells in the second row;
   a third word line in a third row, the third word line being coupled to the control gate of each of a number of the memory cells in the third row;
   a fourth word line in a fourth row, the fourth word line being coupled to the control gate of each of a number of the memory cells in the fourth row;
   means for decoding row addresses and for selecting word lines, wherein if the first row is addressed for one of a read operation and a programming operation and if the first row is not functioning properly, the decoding means selects the third word line, and wherein if the second row is addressed for one of the read and programming operations and if the second row is not functioning properly, the decoding means selects the fourth word line, wherein during a preconditioning operation, if the first row is addressed and if the first row is not functioning properly, the decoding means selects the first word line and the second word line, wherein during the preconditioning operation, if the second row is addressed and if the second row is not functioning properly, the decoding means selects the third word line and the fourth word line;
   means for selecting a number of the plurality of bit lines and for coupling the source region of each of a number of the memory cells coupled to the selected bit lines to a first potential for one of the read and programming operations, and for coupling the source region of each of the memory cells to a second potential for an erasure operation.

2. The memory array defined by claim 1, wherein the first potential is ground potential.

3. The memory array defined by claim 1, wherein the second potential is approximately +12 volts.

4. A method of accessing alternate word lines in a memory array having a plurality of electrically programmable and electrically erasable memory cells each having a source region, a drain region, a floating gate and a control gate, the memory array comprising a plurality of bit lines arranged in columns, each of the plurality of bit lines being coupled to the drain region of each of a number of the memory cells in one column, the memory array further comprising a first word line coupled to the control gate of each of a number of the memory cells in a first row, a second word line coupled to the control gate of each of a number of the memory cells in a second row, a third word line coupled to the control gate of each of a number of the memory cells in a third row, and a fourth word line coupled to the control gate of each of a number of the memory cells in a fourth row, the method comprising the steps of:

(A) selecting the third word line if the first row is addressed for one of a read operation and a programming operation and if the first row is not functioning properly;

(B) selecting the fourth word line if the second row is addressed for one of the read and programming operations and if the second row is not functioning properly;

(C) selecting the first and second word lines if the first row is addressed for a preconditioning operation and if the first row is not functioning properly;

(D) selecting the third and fourth word lines if the second row is addressed for the preconditioning operation and if the second row is not functioning properly.

5. The method of claim 4 wherein the first potential is ground potential.

6. The method of claim 4 wherein the second potential is approximately +12 volts.

7. The memory array of claim 1, wherein the decoding means only selects the first word line if the first row is addressed for one of the read, programming and preconditioning operations and if the first row functions properly, wherein the decoding means only selects the second word line if the second row is addressed for one of the read, programming, and preconditioning operations and if the second row functions properly.

8. The memory array of claim 1, further comprising:

(i) a fifth word line in a fifth row, the fifth word line being coupled to the control gate of each of a number of the memory cells in the fifth row, wherein the first, second, and fifth word lines are grouped together;

(ii) a sixth word line in a sixth row, the sixth word line being coupled to the control gate of each of a number of the memory cells in the sixth row, wherein the third, fourth, and sixth word lines are grouped together, wherein if (1) the fifth row is addressed during one of the read and programming operations and (2) the fifth row is not functioning properly, the decoding means selects the sixth word line, wherein if (3) the second row is addressed during the preconditioning operation, (4) the second row is not functioning properly, and (5) the first row functions properly, the decoding means selects the second and fifth word lines, wherein if (6) the fifth row is addressed during the preconditioning operation and (7) the fifth row is not functioning properly, the decoding means selects the fourth and sixth word lines.

9. The method of claim 4, further comprising the steps of:

(E) selecting only the first word line if (1) the first row is addressed for one of the read, programming, and preconditioning operations and (2) the first row functions properly;

(F) selecting only the second word line if (3) the second row is addressed for one of the read, programming, and preconditioning operations and (4) the second row functions properly.

10. The method of claim 4, wherein the memory array further comprises a fifth word line coupled to the control gate of each of a number of the memory cells in a fifth row and a sixth word line coupled to the control gate of each of a number of the memory cells in a sixth row, wherein the first, second, and fifth word lines are grouped together and the third, fourth, and sixth word lines are grouped together, wherein the method further comprising the steps of:

(i) selecting the sixth word line if (1) the fifth row is addressed for one of the read and programming operations and (2) the fifth row is not functioning properly;

(ii) selecting the second and fifth word lines if (3) the second row is addressed during the preconditioning operation, (4) the second row is not functioning properly, and (5) the first row functions properly;

(iii) selecting the fourth and sixth word lines if (6) the fifth row is addressed during the preconditioning operation and (7) the fifth row is not functioning properly.

* * * * *

UNITED STATES PATENT AND TRADEMARK OFFICE
CERTIFICATE OF CORRECTION

PATENT NO. : 5,233,559  
DATED : August 3, 1993  
INVENTOR(S) : Brennan, Jr.

Page 1 of 2

It is certified that error appears in the above-indentified patent and that said Letters Patent is hereby corrected as shown below:

On title page, item [56]

In the References cited,

| | following "4,538,245 | 9/1985 | Smarandoiu et al. | 365/210 X" | |
|---|---|---|---|---|---|
| insert -- | 4,051,354 | 7/27/77 | Choate | 235 | 312 |
| | 4,250,570 | 2/10/81 | Tsang et al. | 365 | 200 |
| | 4,281,398 | 7/28/81 | McKenny et al. | 365 | 200 |
| | 4,358,833 | 11/9/82 | Folmsbee et al. | 365 | 200 |
| | 4,441,170 | 4/3/84 | Folmsbee et al. | 365 | 200 |
| | 4,519,050 | 5/21/85 | Folmsbee | 365 | 53 |
| | 4,530,074 | 7/16/85 | Folmsbee | 365 | 53 |
| | 4,543,594 | 9/24/85 | Mohsen et al. | 357 | 51 |
| | 4,821,271 | 4/11/89 | Kini et al. | 371 | 68 |
| | 5,031,142 | 7/9/91 | Castro | 365 | 49 |
| | 5,046,046 | 9/3/91 | Sweha et al. | 365 | 200 |
| | 5,050,123 | 9/17/91 | Castro | 365 | 53 |
| | 5,088,066 | 2/11/92 | Castro | 365 | 230.06 |

B.F. Fitzgerald and E.P. Thoma, "Circuit Implementation of Fusible Redundant Addresses on RAMs for Productivity Enhancement," IBM J. Res. Develop., Vol. 24, No. 3, pp. 291-298 (May 1980). --

Column 5, line 25, replace the first occurrence of "drive" with -- driver --.

Column 5, line 66, after "Fig. 2 and" insert -- 3 --.

UNITED STATES PATENT AND TRADEMARK OFFICE
CERTIFICATE OF CORRECTION

PATENT NO.  :  5,233,559

DATED       :  August 3, 1993

INVENTOR(S) :  Brennan, Jr.

It is certified that error appears in the above-indentified patent and that said Letters Patent is hereby corrected as shown below:

Column 13, line 16, replace "sixteeth" with -- sixteenth --.

Signed and Sealed this

Twenty-ninth Day of November, 1994

Attest:

BRUCE LEHMAN

Attesting Officer        Commissioner of Patents and Trademarks